(12) United States Patent
Rieder et al.

(10) Patent No.: US 11,416,730 B2
(45) Date of Patent: Aug. 16, 2022

(54) RADIO-FREQUENCY DEVICE WITH RADIO-FREQUENCY SIGNAL CARRYING ELEMENT AND ASSOCIATED PRODUCTION METHOD

(71) Applicant: Infineon Technologies AG, Neubiberg (DE)

(72) Inventors: Bernhard Rieder, Regensburg (DE); Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/949,155

(22) Filed: Oct. 15, 2020

(65) Prior Publication Data

US 2021/0125021 A1    Apr. 29, 2021

(30) Foreign Application Priority Data

Oct. 24, 2019   (DE) .......................... 102019128779.0

(51) Int. Cl.
| | | |
|---|---|---|
| G06K 19/077 | (2006.01) | |
| H01L 23/66 | (2006.01) | |
| H01Q 1/38 | (2006.01) | |
| H01Q 1/22 | (2006.01) | |

(52) U.S. Cl.
CPC ........ G06K 19/07749 (2013.01); H01L 23/66 (2013.01); H01Q 1/2225 (2013.01); H01Q 1/38 (2013.01)

(58) Field of Classification Search
CPC .............. G06K 19/07749; H01L 23/66; H01Q 1/2225; H01Q 1/38

USPC ......................................................... 235/492
See application file for complete search history.

(56) References Cited

U.S. PATENT DOCUMENTS

| | | | |
|---|---|---|---|
| 2007/0090515 A1* | 4/2007 | Condie ................. | H01L 23/057 257/E21.705 |
| 2007/0193021 A1* | 8/2007 | Kobayashi ........... | H01Q 1/2208 29/601 |
| 2010/0001906 A1 | 1/2010 | Akkermans et al. | |

(Continued)

FOREIGN PATENT DOCUMENTS

| | | |
|---|---|---|
| DE | 102010001407 A1 | 9/2010 |
| DE | 102016224936 A1 | 6/2018 |

*Primary Examiner* — Michael G Lee
*Assistant Examiner* — David Tardif
(74) *Attorney, Agent, or Firm* — Harrity & Harrity, LLP

(57) ABSTRACT

A radio-frequency device comprises a radio-frequency chip, a first connecting element arranged over a chip surface of the radio-frequency chip, the first connecting element being designed to mechanically and electrically connect the radio-frequency chip to a circuit board, and a radio-frequency signal carrying element arranged over the chip surface and electrically coupled to the radio-frequency chip, the radio-frequency signal carrying element being covered by an electrically nonconductive material and being designed to transmit a signal in a direction parallel to the chip surface, wherein the first connecting element and the radio-frequency signal carrying element are arranged at a same level in relation to a direction perpendicular to the chip surface, and wherein the first connecting element is spaced apart from the radio-frequency signal carrying element by way of a region that is free of the electrically nonconductive material.

23 Claims, 11 Drawing Sheets

(56) References Cited

U.S. PATENT DOCUMENTS

| | | | |
|---|---|---|---|
| 2010/0035403 A1* | 2/2010 | Brown | H01L 21/76224 |
| | | | 257/E21.546 |
| 2017/0325365 A1* | 11/2017 | Kuk | H05K 9/0032 |
| 2019/0261509 A1* | 8/2019 | Froese | H05K 1/0221 |
| 2019/0305428 A1* | 10/2019 | Hwang | H01L 23/66 |
| 2019/0334228 A1* | 10/2019 | Haridas | H01Q 3/26 |
| 2020/0253040 A1* | 8/2020 | Dalmia | H01L 23/49822 |
| 2020/0274634 A1* | 8/2020 | Schay | H01Q 3/38 |

\* cited by examiner

RADIO-FREQUENCY DEVICE WITH RADIO-FREQUENCY SIGNAL CARRYING ELEMENT AND ASSOCIATED PRODUCTION METHOD

CROSS REFERENCE TO RELATED APPLICATION

This application claims priority to German Patent Application No. 102019128779.0 filed on Oct. 24, 2019, the content of which is incorporated by reference herein in its entirety.

TECHNICAL FIELD

The present disclosure generally relates to RF (Radio Frequency) technology. For example, the present disclosure relates to RF devices with RF signal carrying elements and methods for producing such RF devices.

BACKGROUND

RF devices can be used for automotive safety applications, for example. In this regard, for example, radar sensors can be used for blind spot detection, automated speed regulation, collision avoidance systems, etc. In this case, the RF devices can be mounted on a circuit board, which generally has to provide an expensive RF laminate for e.g. ultra-short range radar or waveguide feed structures. The radar antennas of the RF devices are often arranged in the housings of the RF devices.

BRIEF SUMMARY

Various aspects relate to a radio-frequency device. The radio-frequency device comprises a radio-frequency chip. The radio-frequency device furthermore comprises a first connecting element arranged over a chip surface of the radio-frequency chip, the first connecting element being designed to mechanically and electrically connect the radio-frequency chip to a circuit board. The radio-frequency device furthermore comprises a radio-frequency signal carrying element arranged over the chip surface and electrically coupled to the radio-frequency chip, the radio-frequency signal carrying element being covered by an electrically nonconductive material and being designed to transmit a signal in a direction parallel to the chip surface. The first connecting element and the radio-frequency signal carrying element are arranged at a same level in relation to a direction perpendicular to the chip surface. The first connecting element is spaced apart from the radio-frequency signal carrying element by way of a region that is free of the electrically nonconductive material.

Various aspects relate to a method for producing radio-frequency devices. The method comprises arranging a plurality of radio-frequency chips, wherein each of the radio-frequency chips comprises a connecting element arranged over a respective chip surface, the connecting element being designed to mechanically and electrically connect the respective radio-frequency chip to a circuit board. The method furthermore comprises arranging a panel having a plurality of radio-frequency signal carrying elements over the chip surfaces of the radio-frequency chips, wherein the radio-frequency signal carrying elements are in each case covered by an electrically nonconductive material and designed to transmit a signal in a direction parallel to the respective chip surface. The method furthermore comprises singulating the panel, wherein a plurality of radio-frequency devices are obtained, wherein each of the radio-frequency devices comprises at least one radio-frequency chip, a connecting element and a radio-frequency signal carrying element, wherein the connecting element and the radio-frequency signal carrying element are arranged at a same level in relation to a direction perpendicular to the chip surface, and wherein the connecting element is spaced apart from the radio-frequency signal carrying element by way of a region that is free of the electrically nonconductive material.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. can be used with respect to the orientation of the figures described. Since the components of the implementations described can be positioned in different orientations, the direction terms can be used for illustration purposes and are not restrictive in any way whatsoever. Other aspects can be used and structural or logical changes can be made, without departing from the concept of the present disclosure. In other words, the following detailed description should not be understood in a restrictive sense.

Schematic views of RF devices in accordance with the disclosure are described below. In this case, the RF devices can be illustrated in a general way in order to describe aspects of the disclosure qualitatively. The RF devices can in each case have further aspects that are not illustrated in the figures for the sake of simplicity. For example, the respective RF devices can be extended by any aspects described in association with other devices or methods in accordance with the disclosure.

Figure 1:
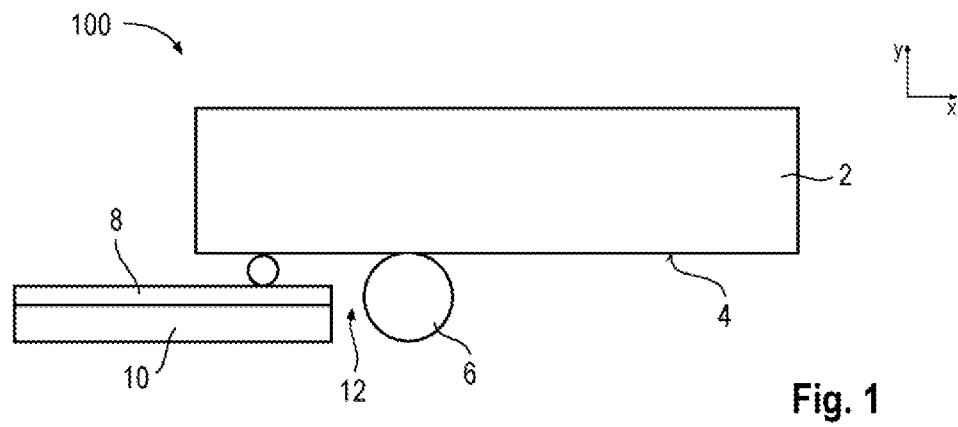
FIG. 1 schematically illustrates a cross-sectional side view of an RF device 100 in accordance with the disclosure.

The RF device 100 in FIG. 1 has an RF chip 2. In the example in FIG. 1, the RF chip 2 is illustrated without possible additional components such as an encapsulation material, for example. The RF device 100 furthermore has a connecting element 6 arranged over a chip surface 4 of the RF chip 2. In the example in FIG. 1, the connecting element 6 is illustrated for example as a solder ball (or solder bump). In further examples, the connecting element 6 can be embodied in a columnar fashion and be fabricated from copper or a copper alloy, for example. The connecting element 6 is designed to mechanically and electrically connect the RF chip 2 or the RF device 100 to a circuit board (not shown). The RF device 100 furthermore has an RF signal carrying element 8 arranged over the chip surface 4 and electrically coupled to the RF chip 2. In the example in FIG. 1, the electrical coupling is provided by a solder ball, for example. In further examples, the electrical coupling can be contactless. The RF signal carrying element 8 can comprise one or more electrical line(s) and/or one or more radiation element(s).

The RF signal carrying element 8 is covered by an electrically nonconductive material 10 and is designed to transmit a signal in a direction parallel to the chip surface 4, e.g. in the x-direction. The connecting element 6 and the RF signal carrying element 8 are arranged at a same level in relation to a direction perpendicular to the chip surface 4, e.g. in relation to the y-direction. The connecting element 6 and the RF signal carrying element 8 can thus at least partly overlap in a side view along the x-direction. The connecting element 6 is spaced apart from the RF signal carrying element 8 by way of a region 12. The region 12 is free of the electrically nonconductive material 10.

Figure 2:
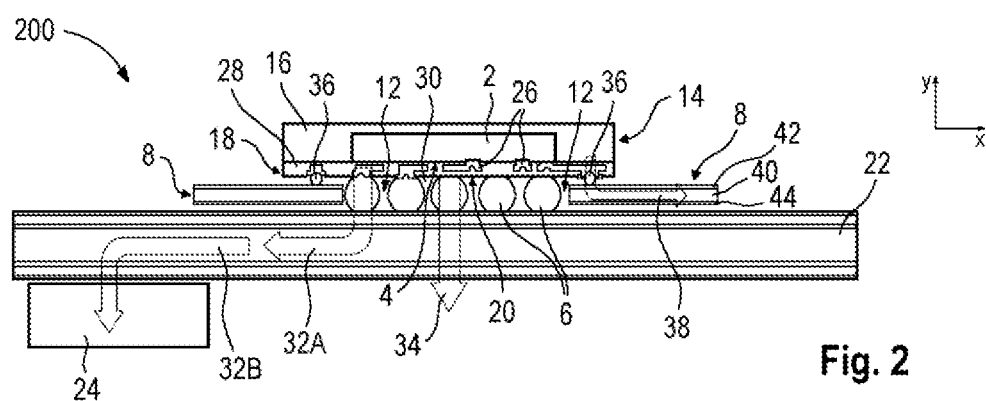
FIG. 2 schematically illustrates a cross-sectional side view of an RF device 200 in accordance with the disclosure.

The RF device 200 in FIG. 2 can be regarded as a more detailed implementation of the RF device 100. The RF device 200 can include an RF package (or RF housing) 14 having an RF chip 2, an encapsulation material 16 and a redistribution layer (or redistribution wiring layer) 18. Furthermore, the RF device 200 can have connecting elements 6 and RF signal carrying elements 8 arranged over a chip surface 4 of the RF chip 2 or over a surface (underside 20) of the RF package 14. The RF device 200 can have a circuit board 22 and a microcontroller 24, which in each case may or may not be regarded as part of the RF device 200.

The RF chip 2 can operate in various frequency ranges. Accordingly, an RF signal carrying element 8 electrically coupled to the RF chip 2 can be designed to transmit signals having frequencies in the frequency ranges. In one example the RF chip 2 can operate in a radio-frequency or microwave frequency range that can generally range from approximately 10 GHz to approximately 300 GHz. By way of example, accordingly, circuits integrated into the RF chip 2 can operate in a frequency range of greater than approximately 10 GHz and the RF signal carrying element 8 can transmit signals having a frequency of greater than approximately 10 GHz. Microwave circuits of this type can comprise for example microwave transmitters, microwave receivers, microwave transceivers, microwave sensors or microwave detectors. The devices described herein can be used for radar applications in which the frequency of the radio-frequency signal is modulated. Radar microwave devices can be used for example in automotive or industrial applications for distance determining/distance measuring systems. By way of example, automatic vehicle speed regulating systems or vehicle anticollision systems can operate in the microwave frequency range, for example in the 24 GHz, 77 GHz or 79 GHz frequency bands.

Alternatively or additionally, the RF chip 2 can operate in a Bluetooth frequency range. Such a frequency range can comprise for example an ISM (Industrial, Scientific and Medical) band between approximately 2.402 GHz and approximately 2.480 GHz. Circuits integrated into the RF chip 2 can accordingly more generally operate in a frequency range of greater than approximately 1 GHz and the RF signal carrying element 8 can accordingly transmit signals having a frequency of greater than approximately 1 GHz.

The RF chip 2 can be at least partly embedded into the encapsulation material 16. In the example in FIG. 2, the side surfaces and the top side of the RF chip 2 can be covered by the encapsulation material 16. In further examples, the top side of the RF chip 2 can be such that it is not covered by the encapsulation material 16. The encapsulation material 16 can protect the RF chip 2 against external influences, such as moisture, leakage currents or mechanical impacts, for example. The encapsulation material 16 can include for example at least one from a mold compound, a laminate, an epoxy, a filled epoxy, a glass-fiber-filled epoxy, an imide, a thermoplastic, a thermosetting polymer, a polymer mixture.

The redistribution layer 18 can contain one or more conductor tracks 26 in the form of metal layers or metal tracks, which can run substantially parallel to the underside (chip surface 4) of the RF chip 2 or to the underside 20 of the RF package 14. A multiplicity of dielectric layers 28 can be arranged between the multiplicity of conductor tracks 26 in order to electrically insulate the conductor tracks 26 from one another. Furthermore, metal layers arranged on different planes can be electrically connected to one another by a multiplicity of through contacts (or vias).

The conductor tracks 26 of the redistribution layer 18 can fulfill the function of redistribution or redistribution wiring in order to electrically couple connections of the RF chip 2 to the connecting elements 6 and/or the RF signal carrying elements 8. In other words, the conductor tracks 26 can be designed to provide connections of the RF chip 2 at other positions of the RF device 200. In the example in FIG. 2, connections of the RF chip 2 can be redistributed to external connections using the redistribution layer 18, which external connections can be arranged outside the contour of the RF chip 2 in a plan view along the y-direction. An RF device having such a spreading-out of the chip connections can be referred to as a fan-out device or fan-out package. In a further example, the RF device 200 can be a fan-in device, in which (in particular all) external connections can be arranged within the contour of the RF chip 2 in a plan view along the y-direction. The RF device 200 can be a wafer level package, for example, which can be produced for example in accordance with an eWLB (embedded Wafer Level Ball Grid Array) method. In this case, the undersides of the RF chip 2 and of the encapsulation material 16 can lie in a common plane, e.g. can be arranged in a coplanar fashion, on account of the production process.

In the example in FIG. 2, the underside of the RF chip 2 can correspond to an active surface of the RF chip 2, e.g. a chip surface into which electronic components are integrated into the semiconductor material of the RF chip 2. In a further example, the top side of the RF chip 2 can correspond to an active surface of the RF chip 2 and redistribution wiring to the underside of the RF chip 2 can be present, such that the integrated electronic components can be electrically contacted from the underside of the device.

The RF chip 2 and the RF package 14 can be mechanically and electrically connected to the circuit board 22 via at least one of the connecting elements 6. In this case, the top side and the underside of the respective connecting element 6 can contact a connection region of the RF package 14 and a connection region of the circuit board 22, respectively. A gap 30 can be formed between the top side of the circuit board 22 and the underside 20 of the RF package 14. The respective connecting element 6 can extend over the entire extent of the gap 30 in the y-direction. In other words, the extent of the gap 30 in the y-direction can be defined by the size of the connecting elements 6. Consequently, the connecting elements 6 can have a larger extent than the RF signal carrying elements 8 in the y-direction.

In one example, the gap 30 can be an air gap. In a further example, the gap 30 can be filled with a material, for example an underfill material. The connecting elements 6 and the RF signal carrying elements 8 can be arranged in the gap 30 and can be spaced apart from one another by way of the gap 30 or a region of the gap 30. Accordingly, the connecting elements 6 and the RF signal carrying elements 8 need not necessarily physically contact one another.

Figure 6:
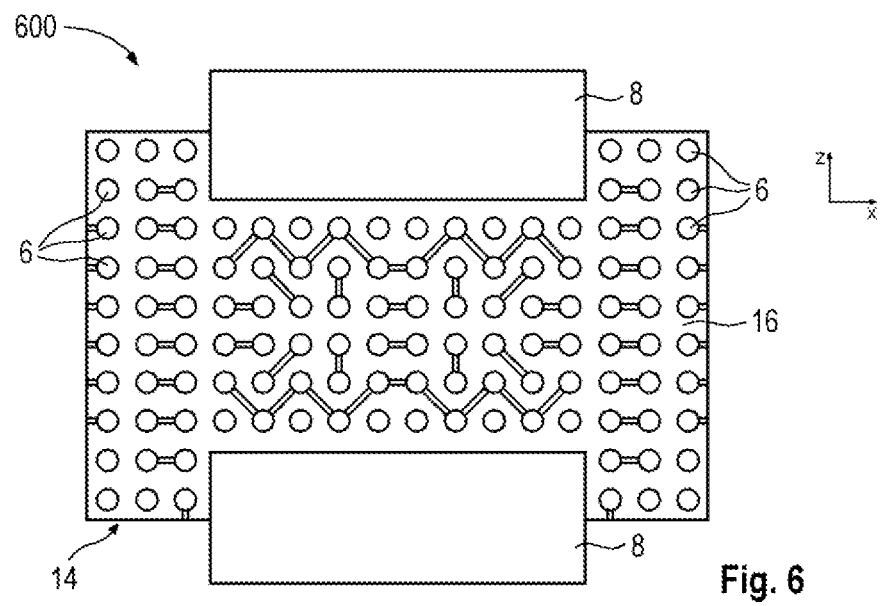
FIG. 6 schematically illustrates a plan view of an RF device 600 in accordance with the disclosure.

In the example in FIG. 2, the connecting elements 6 are illustrated as solder balls, for example. In further examples, the connecting elements 6 can be embodied in a columnar fashion and can be fabricated from copper or a copper alloy, for example. Five solder balls are shown by way of example in the side view in FIG. 2. In further examples, the number of connecting elements 6 can deviate therefrom, in particular can be greater, as is shown in FIG. 6, for example.

One or more of the connecting elements 6 can be designed to transmit DC and/or AC signals. Besides the RF circuits already mentioned, the RF chip 2 can also have integrated circuits which can operate in a non-radio-frequency or low-frequency frequency range. By way of example, such integrated circuits can operate in a frequency range of less than approximately 10 GHz or less than approximately 5 GHz or less than approximately 1 GHz or less than approximately 500 MHz. Accordingly, one or more of the connecting elements 6 can be designed to transmit signals having these frequencies. The signals can be transmitted for example from the integrated low-frequency circuits of the RF chip 2 via the connecting elements 6 to the circuit board 22 (cf. signal 32A). Furthermore, the signals can be forwarded via the circuit board 22 to the microcontroller 24 and be processed by the latter (cf. signal 32B). Conversely, signals can also be fed into the RF chip 2 via the connecting elements 6.

One or more of the connecting elements 6 can be designed to provide a thermal path. Such a thermal path can extend substantially in the y-direction away from the radio-frequency chip 2 (cf. heat 34). Heat can be generated by the RF chip 2 during operation of the RF device 200, which heat can thus be dissipated effectively from the RF chip 2. Overheating of the RF device 200 or of the RF chip 2 can be avoided as a result. In one example, the RF device 200 can furthermore have a heat sink (not shown), which for example can be arranged on the underside of the circuit board 22 and can provide further dissipation of heat.

The RF signal carrying element 8 and the RF chip 2 and the RF package 14 can be mechanically and electrically connected via one or more second connecting elements 36. In the example in FIG. 2, the connecting elements 36 are illustrated in the form of solder balls, for example. The RF chip 2 and the RF package 14 can thus be connected to the RF signal carrying element 8 on the basis of a thermal heating process (e.g. melting with subsequent cooling and solidifying) of the material of the connecting elements 36. In further examples, the connecting elements 36 can be embodied in a columnar fashion and can be fabricated from copper or a copper alloy, for example. The second connecting elements 36 can have a smaller extent than the connecting elements 6 in relation to the y-direction. One or more of the second connecting elements 36 can be designed to transmit radio-frequency signals generated by the RF chip 2 to the respective RF signal carrying element 8 (cf. signal 38).

FIG. 2 shows two RF signal carrying elements 8 by way of example. In further examples, the number of RF signal carrying elements can be chosen differently depending on the type of RF device 200. The respective RF signal carrying element 8 can have a dielectric substrate 40. Metal layers 42 and 44 can be arranged on the top side and underside of the dielectric substrate 40. In the example in FIG. 2, the lower metal layer 44 can be an electrical ground layer. The upper metal layer 42 can be structured and form an antenna layer.

The dielectric substrate 40 can be produced from or include at least one from an FR-4 material, a PTFE material, a low loss dielectric material, a ceramic material, a glass material, etc. The loss factor tan δ of the material of the dielectric substrate 40 can be less than approximately 0.015, in particular less than approximately 0.005. The relative permittivity $\varepsilon_r$ of the material over the dielectric substrate 40 can be less than approximately 4, in particular less than approximately 3.5.

The antenna layer 42 can comprise one or more antenna elements (or radiation elements), for example transmitting antenna elements and/or receiving antenna elements. In this case, each of the antenna elements can include a plurality of conductive patches (or patch antennas), which can be electrically connected to one another, in particular in the form of a patch column or a patch branch. The radiation elements can be arranged in particular outside the contour of the RF package 14 as viewed in the y-direction. RF signals generated by the RF chip 2 can be transmitted to the radiation elements of the antenna layer 42 via the second connecting element 36 and signal carrying sections of the antenna layer 42. The radiation elements can be designed to emit the RF signals in particular upward in the y-direction. The antenna layer 42 and the lower metal layer 44 embodied as electrical ground can be fabricated from or include a suitable metal or a suitable metal alloy, such as e.g. copper. In one example, the RF signal carrying element 8 can be formed from a copper-clad PTFE material.

In FIG. 2, the underside of the RF signal carrying element 8 can be spaced apart from the top side of the circuit board 22. In one example, the RF signal carrying element 8 need not necessarily be designed to feed RF signals into the circuit board 22. In a further example, RF signals can be fed into the circuit board by the RF signal carrying element 8. Such a signal feed can be effected via further connecting elements (not shown) or in a contactless fashion. The RF signal carrying element 8 can have a larger extent than one or more of the connecting elements 6 in the x-direction. In particular, the RF signal carrying element 8, as viewed in the y-direction, can project beyond the contour of the RF chip 2 or beyond the contour of the RF package 14 and thus form a fan-out structure.

The RF signal carrying element 8 can be designed to transmit or redistribute RF signals in the x-direction or in a plane perpendicular to the y-direction. For this reason, radio-frequency-conducting structures that can provide such redistribution can be dispensed with in the regions of the circuit board 22 below the RF signal carrying elements 8. Such radio-frequency-conducting structures can usually be embodied in the form of an RF laminate additionally arranged on the circuit board 22. In comparison with RF devices having an additionally arranged RF laminate, RF devices having RF signal carrying elements in accordance with the disclosure can have lower production costs.

One or more of the RF signal carrying elements 8 can be arranged within the gap 30. An otherwise unused volume of the gap 30 can accordingly be used by the RF signal carrying elements 8, as a result of which the size of the RF device 200 can be reduced.

The antenna elements of the RF signal carrying elements 8 can be arranged outside the RF package 14 or outside the encapsulation material 16. The size of the RF package 14 and the production costs of the RF device 200 can be reduced as a result.

Figure 3:
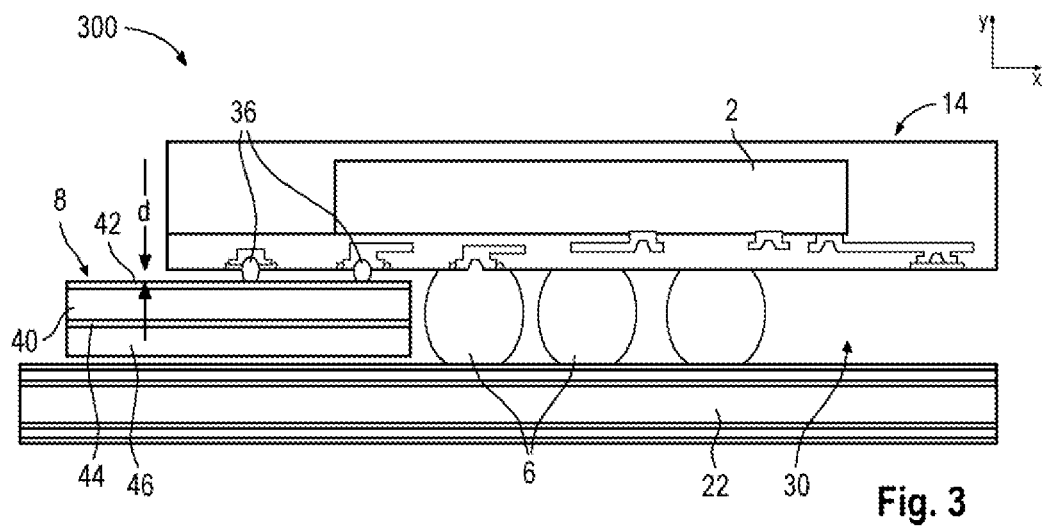
FIG. 3 schematically illustrates a cross-sectional side view of an RF device 300 in accordance with the disclosure.

The RF device 300 in FIG. 3 can be at least partly similar to the RF device 200 in FIG. 2 and include similar components. Explanations above concerning FIG. 2 can therefore also apply to the example illustrated in FIG. 3, and vice-versa. FIG. 3 shows only the left-hand part of the RF device 300 for the sake of simplicity.

In contrast to FIG. 2, the RF device 300 can additionally have a dielectric layer 46 arranged on the underside of the RF signal carrying element 8. The dielectric layer 46 can be designed to electrically insulate the RF signal carrying element 8 and the circuit board 22 from one another. Furthermore, the dielectric layer 46 can be designed to mechanically stabilize the possibly elastic or flexible RF signal carrying element 8. The dielectric layer 46 can be fabricated from any dielectric material suitable therefor, for example from an FR-4 material.

The semiconductor package 14 can be mechanically and electrically connected to the circuit board 22 using a soldering process, for example. Before the soldering process, the substantially spherical connecting elements 6 can have a diameter in a range of approximately 250 micrometers to approximately 500 micrometers. The connecting elements 6 can be deformed during the soldering process, such that the gap 30 can have an extent in a range of approximately 220 micrometers to approximately 440 micrometers in the y-direction after the soldering process. The RF signal carrying element 8 can have an extent of approximately 100 micrometers to approximately 150 micrometers in the y-direction. A typical value for the extent of the RF signal carrying element 8 in the y-direction can be approximately 125 micrometers, for example. The dielectric layer 46 can have an extent in a range of approximately 200 micrometers to approximately 400 micrometers in the y-direction. Before a soldering process, the substantially spherical second connecting elements 36 can have a diameter of up to 100 micrometers. After the soldering process, a distance "d" between the underside of the RF package 14 and the top side of the RF signal carrying element 8 can be in a range of approximately 40 micrometers to approximately 60 micrometers. A typical value for the distance "d" can be approximately 50 micrometers, for example.

Figure 4:
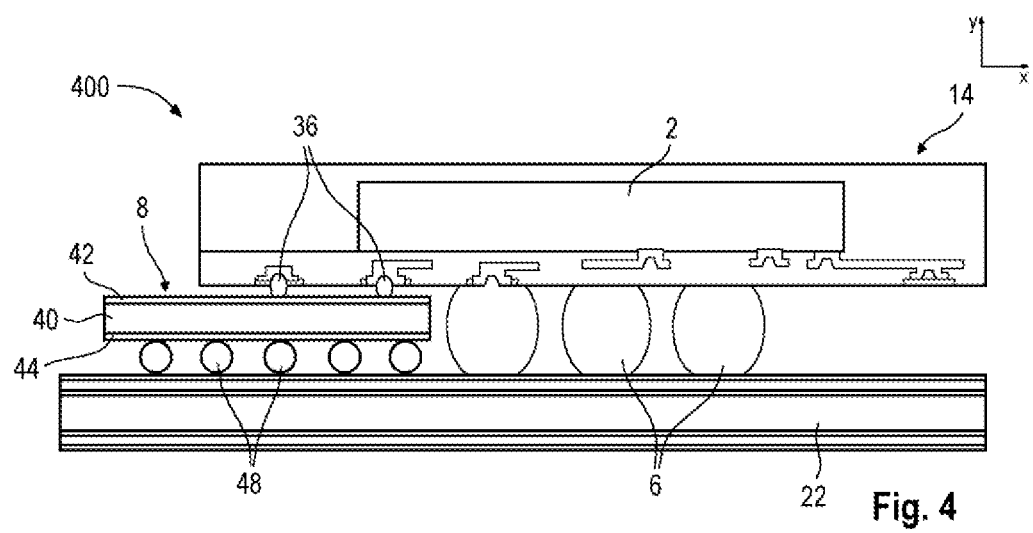
FIG. 4 schematically illustrates a cross-sectional side view of an RF device 400 in accordance with the disclosure.

The RF device 400 in FIG. 4 can be at least partly similar to the RF devices 200 and 300. In contrast to FIGS. 2 and 3, the RF device 400 can have one or more third connecting elements 48, which can be arranged on the underside of the RF signal carrying element 8. In the example in FIG. 4, the third connecting elements 48 are illustrated as solder balls (or solder bumps), for example. In further examples, the third connecting elements 48 can be embodied in a different way, for example in the form of columns, which can be fabricated from copper or a copper alloy, for example. The third connecting elements 48 can be designed to mechanically and electrically connect the RF signal carrying element 8 to the circuit board 22. Furthermore, the third connecting elements 48 can be designed to mechanically stabilize the possibly elastic or flexible RF signal carrying element 8. As already explained in association with FIG. 2, the RF signal carrying element 8 can have one or more antenna elements on its top side, which antenna elements can be arranged outside the contour of the RF package 14 as viewed in the y-direction. The antenna elements can be designed to emit RF signals generated in the RF chip 2 and/or to receive RF signals via an air interface and to forward them to the RF chip 2.

As an alternative or in addition to the function of the antenna elements described, the RF signal carrying element 8 can be designed to transmit RF signals from the RF chip 2 to the circuit board 22, and vice-versa. The RF signal carrying element 8 can thus be designed to transmit RF signals not only in the x-direction or in a plane perpendicular to the y-direction, but also in the y-direction. For this purpose, the RF signal carrying element 8 can have internal electronic wiring or redistribution structures, via which RF signals can be transmitted from the top side of the RF signal carrying element 8 to the underside of the RF signal carrying element 8. In the example in FIG. 4, such internal wiring structures of the RF signal carrying element 8 are not explicitly illustrated for the sake of simplicity. In one example, the RF signal carrying element 8 can be embodied in the form of a daughterboard, which can provide the described signal transmission in the y-direction. The daughterboard can furthermore be designed to mechanically and electrically connect the RF device 400 or the RF package 14 to the circuit board 22.

Figure 5:
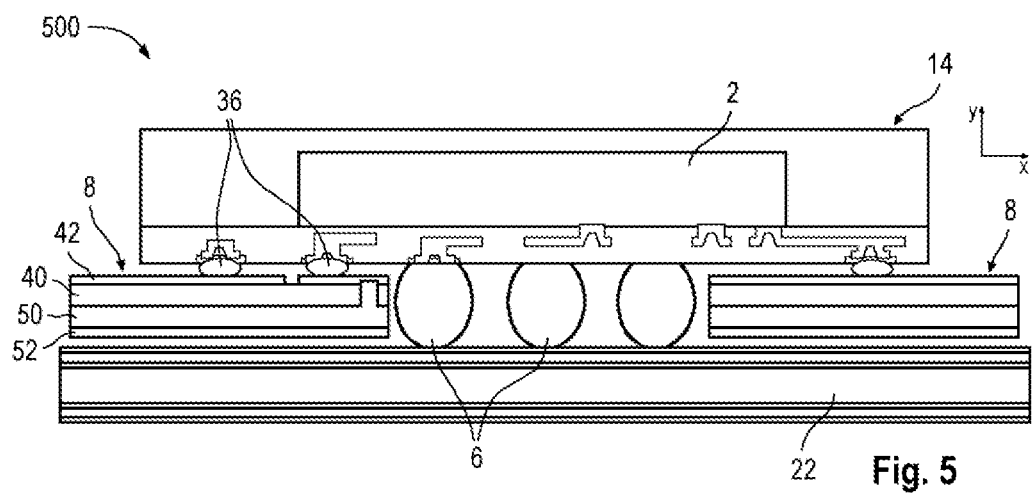
FIG. 5 schematically illustrates a cross-sectional side view of an RF device 500 in accordance with the disclosure.

In the case of the RF device 500 in FIG. 5, the RF signal carrying element 8 can have a metal layer 50 and/or a dielectric layer 52 on its underside. The metal layer 50 can be similar to the lower metal layer 44 embodied as electrical ground in FIG. 2 and can have identical functionalities. The metal layer 50 can furthermore be designed to match the coefficients of thermal expansion of the RF package 14 and of the RF signal carrying element 8 to one another. Furthermore, the metal layer 50 can be designed to mechanically stabilize the RF signal carrying element 8. The metal layer 50 can be fabricated from steel or Invar, for example. The dielectric layer 52 can be similar to the dielectric layer 46 in FIG. 3 and can have identical functionalities. In one example, the dielectric layer 52 can be fabricated from a low loss dielectric material. In a further example, the loss factor tan δ of the material of the dielectric layer 52 can be greater than the loss factor of low loss dielectric materials.

In the examples in FIGS. 1 to 5, the electrical couplings between the RF signal carrying element 8 and the RF package 14 and the circuit board 22 are provided by connecting elements 36 and 48, respectively. As an alternative thereto, in further examples these electrical couplings can be embodied in a non-galvanic or contactless fashion. By way of example, a corresponding transmission of RF signals can be realized using capacitive coupling. The respective transmitter and/or receiver of the RF signals can have one or more coupling structures designed to couple an RF signal into the respective other component, and vice-versa. A coupling structure can include e.g. one or more patch antennas. By way of example, the electrical coupling between the RF package 14 and the RF signal carrying element 8 that is provided by the second connecting elements 36 can be replaced by a contactless electrical coupling. For this purpose, a coupling structure can be arranged on the underside of the RF package 14, which coupling structure capacitively couples RF signals into the antenna layer 42 of the RF signal carrying element 8.

The RF device 600 in FIG. 6 can be similar to the RF device 200 in FIG. 2, for example. The RF device 600 can have two RF signal carrying elements 8, which can be arranged over opposite side edges of the RF package 14 and be aligned therewith. In the example in FIG. 6, the RF signal carrying elements 8 are arranged substantially centrally over the respective side edge of the RF package 14. Each of the RF signal carrying elements 8 can have a smaller extent than the RF package 14 in the x- and z-directions. The RF signal carrying elements 8 can each be embodied in a substantially rectangular fashion and extend beyond the contour of the semiconductor package 14, e.g. form a fan-out structure. In the example in FIG. 6, the connecting elements 6 for transmitting low-frequency signals, e.g. the low-frequency connections of the RF device 600, can be such that they are not covered by the RF signal carrying elements 8. In contrast thereto, the RF signal carrying elements 8 can cover the radio-frequency connections of the radio-frequency device (cf. e.g. connecting elements 36 in FIG. 2).

Figure 7:
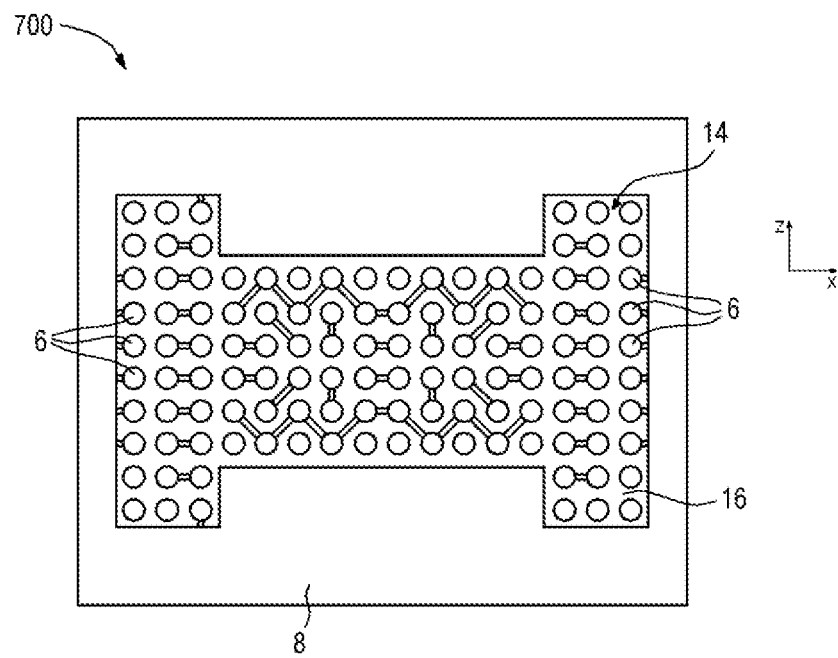
FIG. 7 schematically illustrates a plan view of an RF device 700 in accordance with the disclosure.

In the plan view in FIG. 7, the radio-frequency signal carrying element 8 of the RF device 700 can have a frame-shaped structure along the contour of the RF package 14 or the RF chip contained therein. In this case, the (outer) contour of the RF package can lie (in particular completely) within the (outer) contour of the RF signal carrying element 8. In the example in FIG. 7, the RF signal carrying element 8 can be embodied in an integral fashion and form a closed frame-shaped structure. In further examples, the frame-shaped structure can be open at one or more locations, such that the RF signal carrying element 8 can also be formed from a plurality of pieces. The substantially frame-shaped structure of the RF signal carrying element 8 can stabilize a positioning of the RF device 700 during and/or after the production thereof and in particular prevent tilting of the device.

Figure 8:
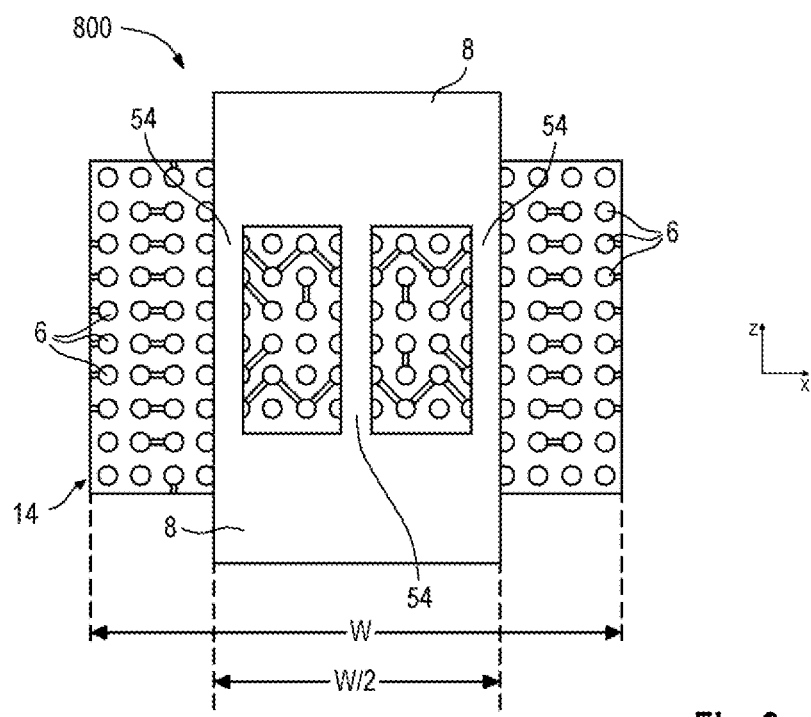
FIG. 8 schematically illustrates a plan view of an RF device 800 in accordance with the disclosure.

The RF device 800 in FIG. 8 can be similar to the RF device 600 in FIG. 6. In comparison with FIG. 6, the RF device 800 can additionally have one or more connecting members or connecting webs 54, which can provide stabilization of the RF device 800 during and/or after the production thereof. Three connecting members or connecting webs 54 are shown in the example in FIG. 8. In further examples, the number of connecting members can deviate therefrom and can generally be greater than two. In comparison with FIG. 7, the RF signal carrying element 800 in FIG. 8 can have a reduced surface area in the x-z-plane. In the x-direction, the side length of the RF package 14 can be greater than the side length of the RF signal carrying element 8. In the example in FIG. 8, the side length of the RF signal carrying element 8 can correspond to approximately half the side length "w" of the RF package 14.

The RF signal carrying elements 8 in FIGS. 6 to 8, despite their different geometric shape, can have identical or similar RF signal carrying structures, antenna structures and/or functionalities.

Figure 9:
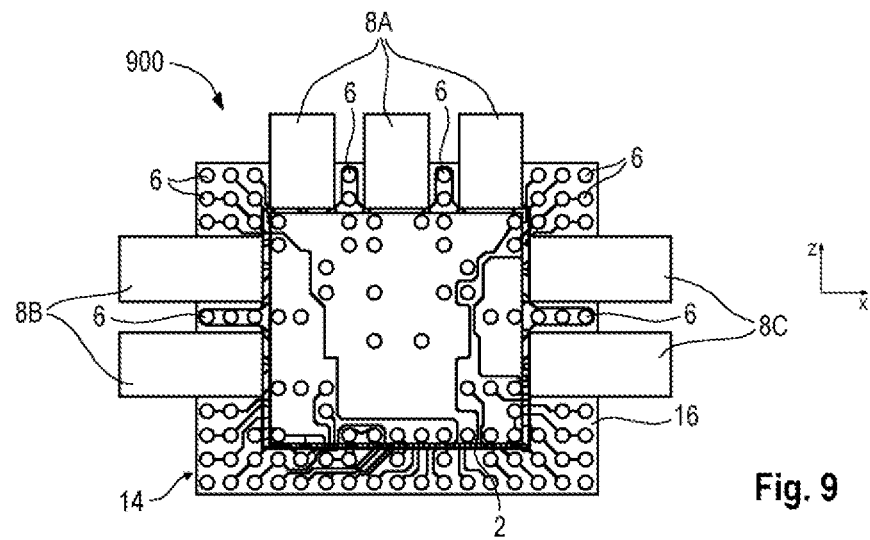
FIG. 9 schematically illustrates a plan view of an RF device 900 in accordance with the disclosure.

The RF device 900 in FIG. 9 can have a plurality of RF signal carrying elements 8 arranged over three side edges of the RF package 14. In the example in FIG. 9, three RF signal carrying elements 8A are arranged over the upper side edge and in each case two RF signal carrying elements 8B and 8C are arranged over the left and right side edges, respectively, of the RF package 14. The number of RF signal carrying elements 8 shown is by way of example and not restrictive. In the example in FIG. 9, in particular one RF signal carrying element 8 per RF connection of the RF package 14 can be provided and arranged over the latter.

Figure 10:
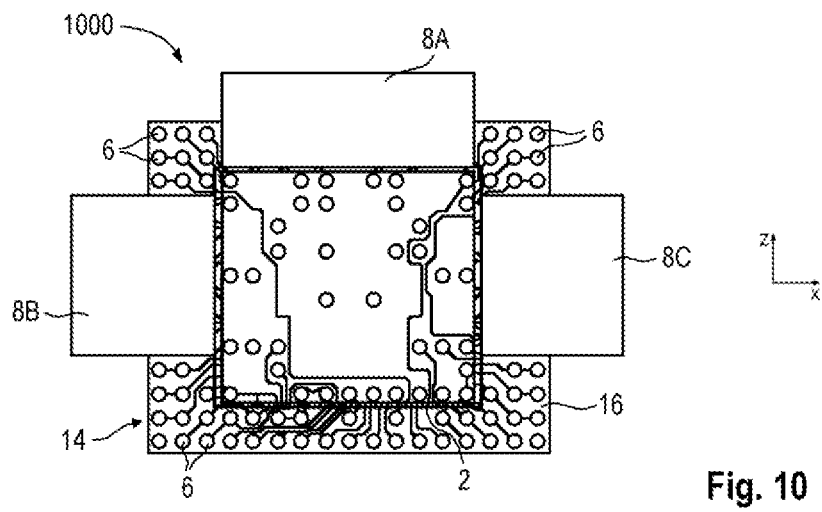
FIG. 10 schematically illustrates a plan view of an RF device 1000 in accordance with the disclosure.

The RF device 1000 in FIG. 10 can be similar to the RF device 900. In contrast to FIG. 9, in FIG. 10 only one RF signal carrying element 8 is arranged over each of the three side edges of the RF package 14. By way of example, in FIG. 10 the three RF signal carrying elements 8A of the RF device 900 can be combined to form a single RF signal carrying element 8A. The same can apply to the RF signal carrying elements 8B and 8C.

Figure 11:
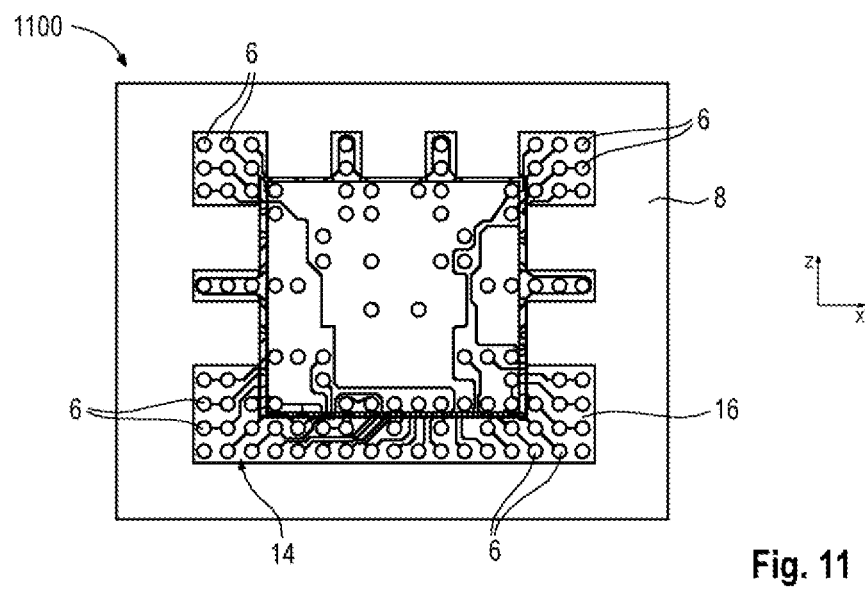
FIG. 11 schematically illustrates a plan view of an RF device 1100 in accordance with the disclosure.

In the RF device 1100 in FIG. 11, the RF signal carrying element 8 can have a frame-shaped structure for stabilizing the device during and/or after the production thereof. In FIGS. 9 and 11, the same low-frequency connections 6 of the RF package 14 can be such that they are not covered by the RF signal carrying elements 8.

The RF signal carrying elements 8 in FIGS. 9 to 11, despite their different geometric shape, can have identical or similar RF signal carrying structures, antenna structures and/or functionalities.

Figure 12:
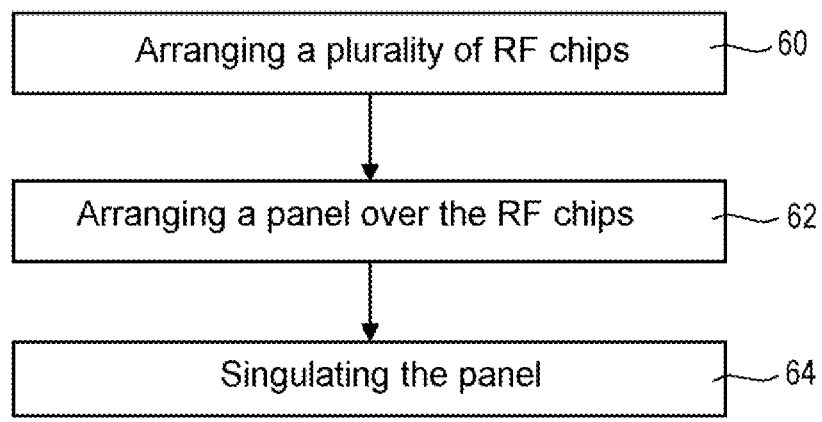
FIG. 12 illustrates a flow diagram of a method in accordance with the disclosure for producing RF devices.

FIG. 12 shows a flow diagram of a method in accordance with the disclosure for producing RF devices. The method can be used to fabricate one of the above-described RF devices in accordance with the disclosure. The method is illustrated generally in order to describe aspects of the disclosure qualitatively and can have further aspects. By way of example, the method can be extended by one of the aspects described in association with other methods and RF devices in accordance with the disclosure.

60 involves arranging a plurality of RF chips. Each of the RF chips comprises a connecting element arranged over a respective chip surface, the connecting element being designed to mechanically and electrically connect the respective RF chip to a circuit board. 62 involves arranging a panel having a plurality of RF signal carrying elements over the chip surfaces of the RF chips. The RF signal carrying elements are in each case covered by an electrically nonconductive material and designed to transmit a signal in a direction parallel to the respective chip surface. 64 involves singulating the panel, wherein a plurality of RF devices are obtained. Each of the RF devices comprises at least one RF chip, a connecting element and an RF signal carrying element. The connecting element and the RF signal carrying element are arranged at a same level in relation to a direction perpendicular to the chip surface. The connecting element is spaced apart from the RF signal carrying element by way of a region that is free of the electrically nonconductive material.

Figure 13A:
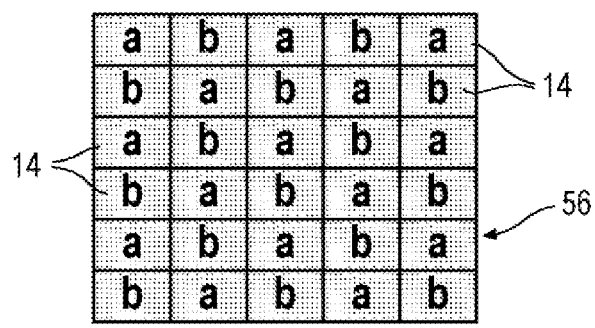
FIGS. 13A to 13G, which schematically illustrate a method in accordance with the disclosure for producing RF devices.
Figure 13B:
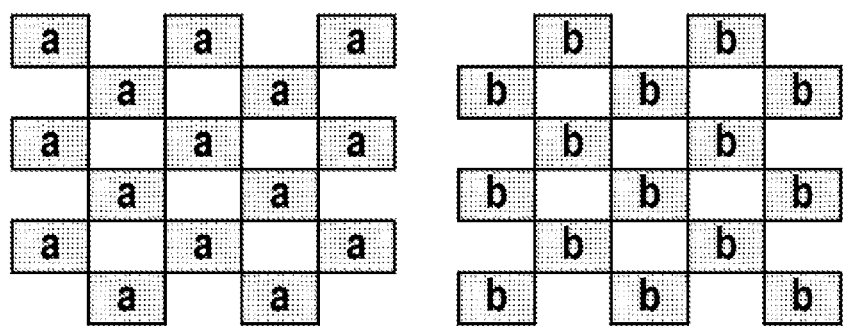
Figure 13C:
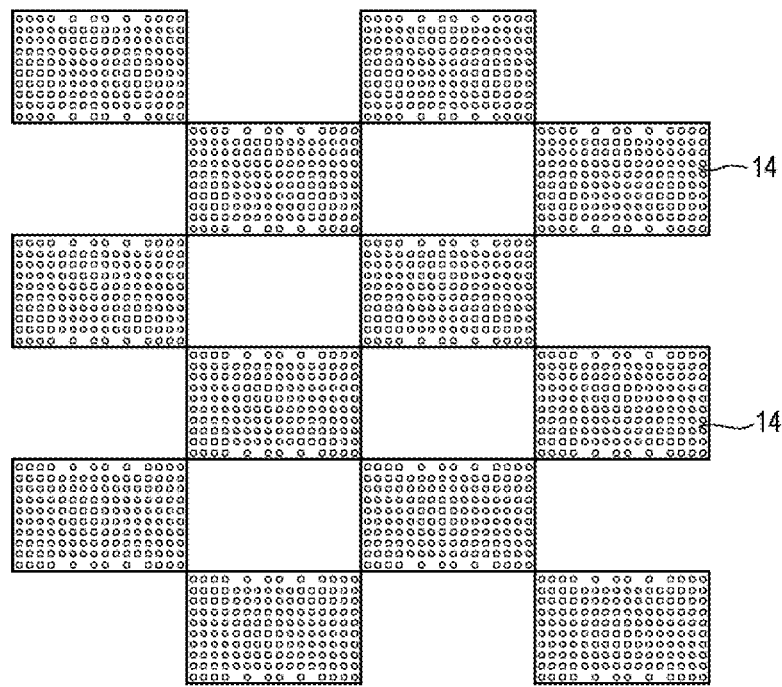
Figure 13D:
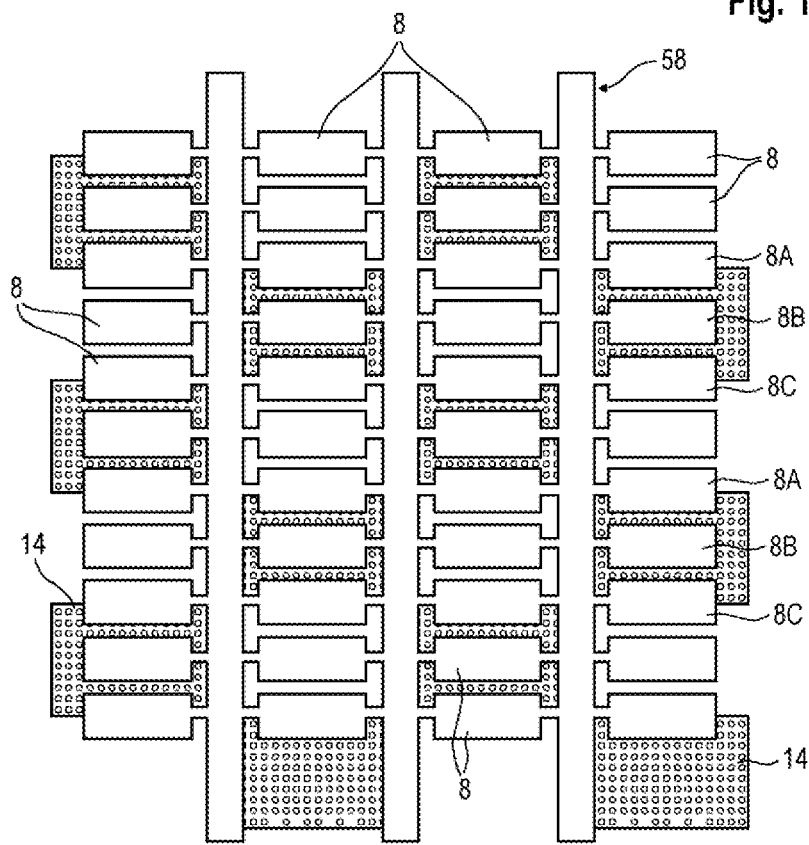
Figure 13E:
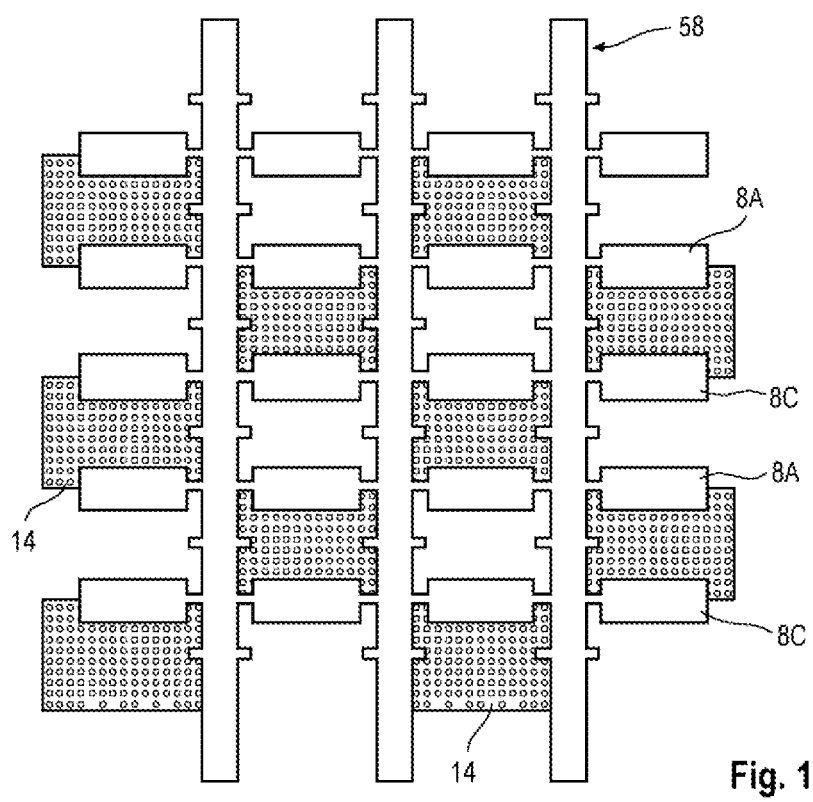
Figure 13F:
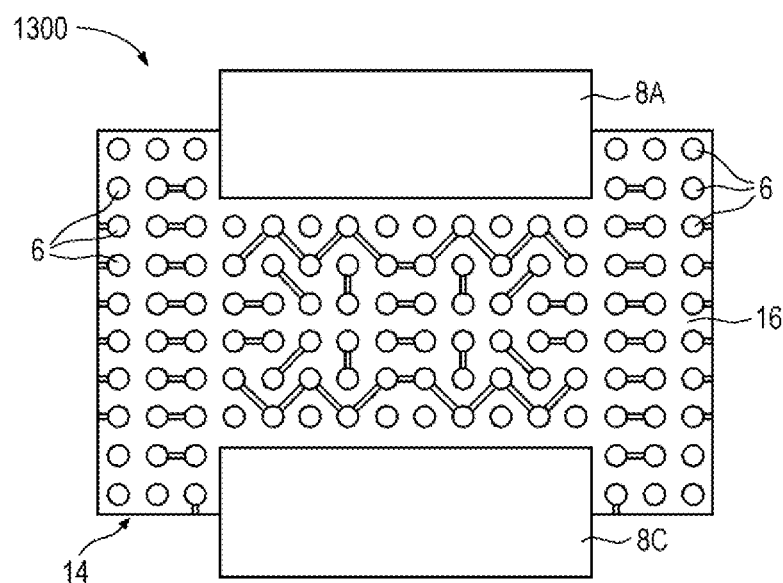

The method shown in FIGS. 13A to 13G can be regarded as a more detailed implementation of the method in FIG. 12. An RF device 1300 produced in accordance with the method in FIG. 13 is shown in FIG. 13F. The RF device 1300 can be similar to the RF device in FIG. 6, for example.

In FIG. 13A, a wafer 56 having a plurality of RF chips or a plurality of RF packages 14 can be provided. The RF packages 14 can be identical RF packages. By way of example, each of the RF packages 14 can correspond to the RF package in FIG. 2. FIG. 13A shows thirty RF packages 14, for example, wherein fifteen RF packages can form a first checkered pattern (cf. "a") and the further fifteen RF packages can form a second checkered pattern (cf. "b").

In FIG. 13B, the first and second checkered patterns formed by the RF packages 14 are illustrated separately for elucidation purposes. In this case, the first checkered pattern can be in particular the inverse of the second checkered pattern.

In FIG. 13C, the wafer 56 from FIG. 13A may have been singulated into the individual RF packages 14. The RF packages 14 of the first checkered pattern can be arranged in the form of the first checkered pattern on an (in particular temporary) carrier (not shown). FIG. 13C shows a plan view of the RF packages 14, in which connections or connecting elements of the RF packages 14 are discernible. Each of the RF packages 14 or of the associated RF chips can comprise a connecting element arranged over a respective chip surface, the connecting element being designed to mechanically and electrically connect the respective RF chip to a circuit board.

In FIG. 13D, a panel 58 having a plurality of RF signal carrying elements 8 can be arranged over the RF packages 14 from FIG. 13C. In accordance with the disclosure, the panel 58 can be an assemblage or a group of a plurality of RF signal carrying elements 8. Within the panel 58, the RF signal carrying elements 8 can be arranged in particular in a periodic gridlike structure. In this case, the RF signal carrying elements 8 can be arranged laterally next to one another. The specific implementation of the RF signal carrying elements 8 of the panel 58 and their relative arrangement with respect to one another may depend on the type of RF device(s) to be produced. In the example in FIG. 13D, the RF signal carrying elements 8 are embodied in a substantially rectangular fashion, are aligned with one another in relation to their side edges and are arranged laterally next to one another in a gridlike structure. RF devices which can be similar to the RF devices in FIGS. 2 and 6 can be produced in the example method in FIG. 13. Accordingly, each of the RF signal carrying elements 8 can be similar to the RF signal carrying elements 8 in FIGS. 2 and 6. In the further examples in FIGS. 14 and 15, the respective panel can have a different periodic gridlike structure of a plurality of RF signal carrying elements 8 which can be arranged laterally next to one another. In FIG. 13D, the individual RF signal carrying elements 8 can be mechanically connected to one another via connecting webs, such that the panel 58 can be embodied in an integral fashion. The panel 58 can be arranged relative to the RF packages 14 in such a way that each of the RF packages 14 is covered by three of the RF signal carrying elements 8A to 8C. In this case, the respective upper RF signal carrying element 8A and the respective lower RF signal carrying element 8C can be arranged relative to the respective RF package 14, as shown in FIG. 6.

In FIG. 13E, the panel 58 can be at least partly singulated. In this case, the central RF signal carrying elements 8B can be removed, such that only the upper RF signal carrying elements 8A and the lower RF signal carrying elements 8C are still arranged over the RF packages 14. In the example in FIG. 13E, the panel 58 can have the RF signal carrying elements 8A and 8C and the connecting webs. In a further example, the panel 58 may have been singulated in such a way that the connecting webs have already been completely separated from the upper and lower RF signal carrying elements 8A and 8C and are still connected only to the central RF signal carrying elements 8B.

FIG. 13F shows an RF device 1300 which can be obtained after the arrangement shown in FIG. 13E has been singulated. The RF device 1300 can correspond to the RF device in FIG. 6, for example.

Figure 13G:
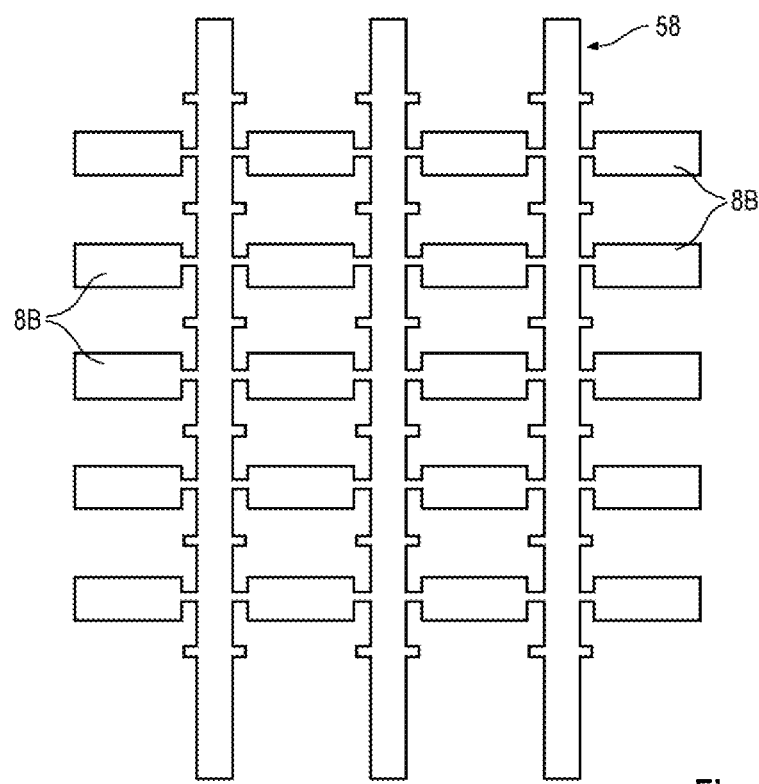

FIG. 13G shows the panel 58 after the upper and lower RF signal carrying elements 8A and 8C have been separated. The panel 58 can thus still comprise only the central RF signal carrying elements 8B, which can be connected to one another via the connecting webs. The connecting webs can be the connecting webs from FIG. 13E or additionally provided connecting webs.

In further method steps, the RF packages 14 of the second checkered pattern can be arranged in the form of the second checkered pattern on an (in particular temporary) carrier (not shown). With the panel 58 in FIG. 13G, further RF devices 1300 can then be produced by applying the method steps from FIGS. 13D to 13F.

Figure 14A:
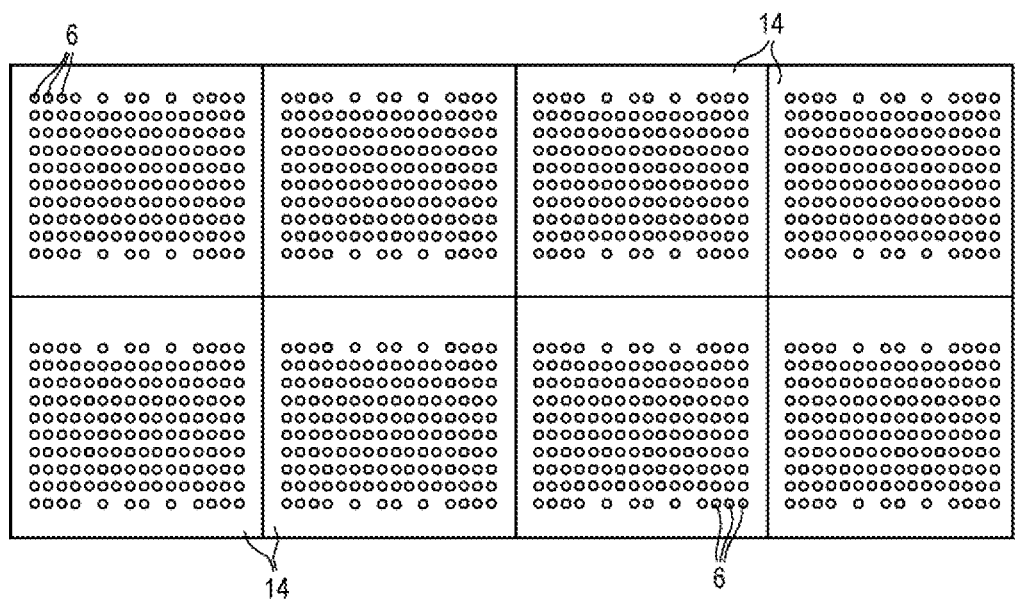
FIGS. 14A to 14D, which schematically illustrate a method in accordance with the disclosure for producing RF devices.
Figure 14B:
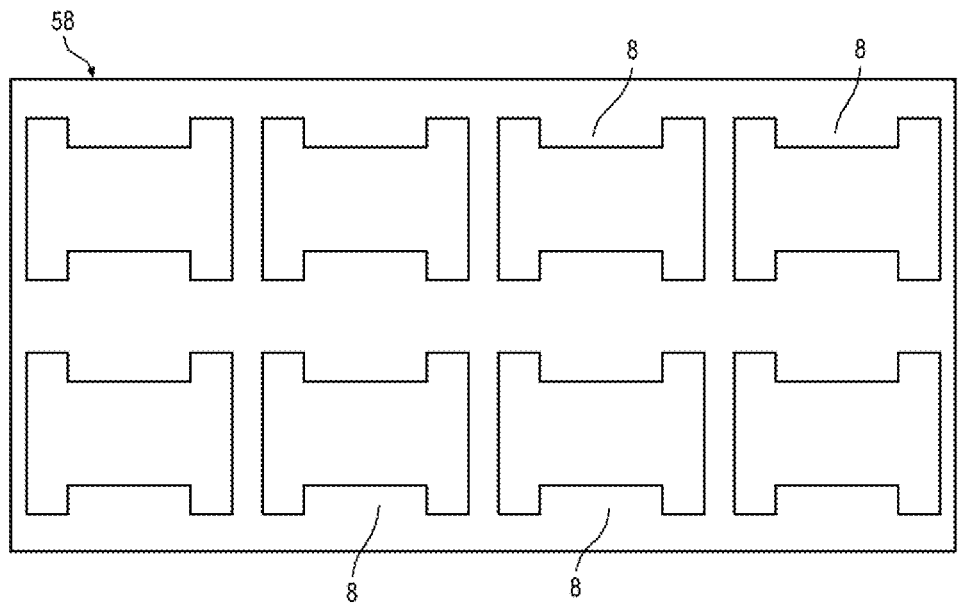
Figure 14C:
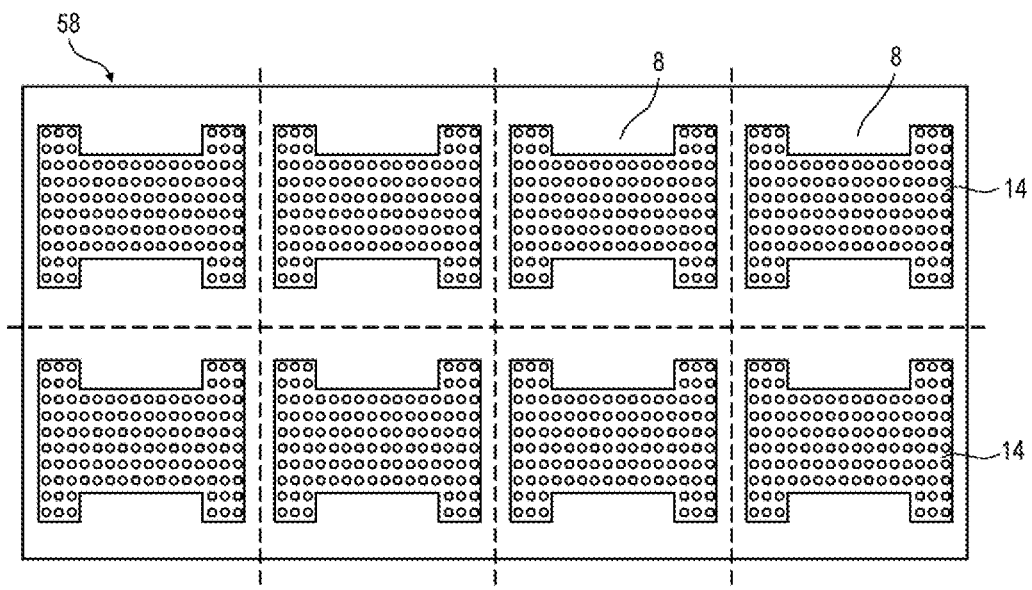
Figure 14D:
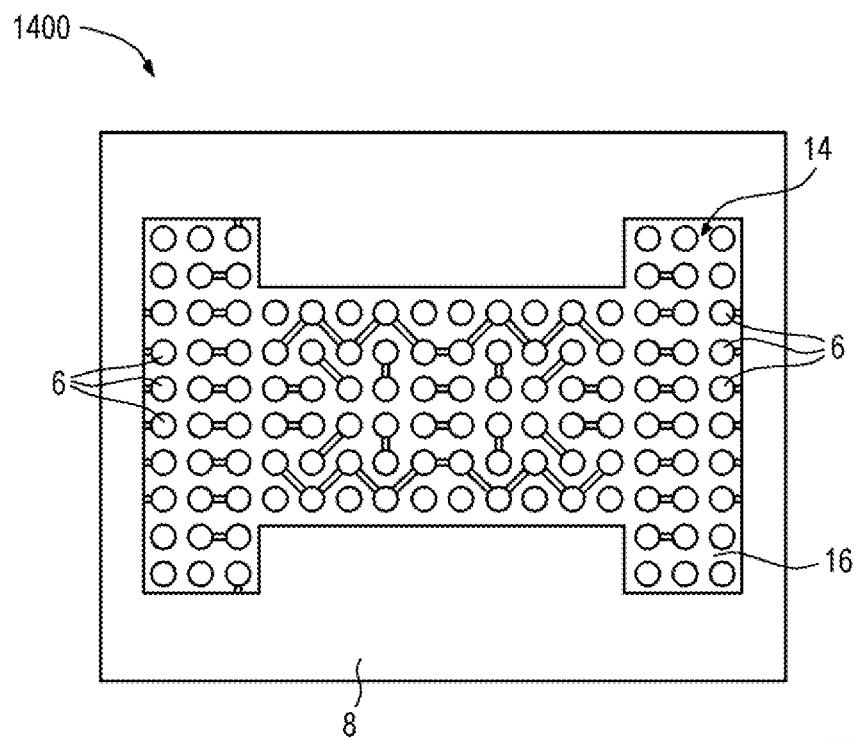

The method shown in FIGS. 14A and 14D can be regarded as a more detailed implementation of the method in FIG. 12. An RF device 1400 produced in accordance with the method in FIG. 14 is shown in FIG. 14D. The RF device 1400 can be similar to the RF device 700 in FIG. 7, for example.

In FIG. 14A, a plurality of RF packages 14 can be provided. In one example, the RF packages 14 can be present in an integral and continuous fashion in the form of a wafer. In a further example, the RF packages 14 can already have been singulated and arranged next to one another.

FIG. 14B shows a panel 58 having a plurality of RF signal carrying elements 8 indicated by dashed lines. The individual RF signal carrying elements 8 can be mechanically connected to one another, e.g. the panel 58 can be embodied in an integral fashion. The individual RF signal carrying elements 8 can have a shape as shown in FIG. 7.

In FIG. 14C, the panel 58 can be arranged over the RF packages 14 in such a way that each of the RF signal carrying elements 8 is positioned over a respective RF package 14, as is shown in FIG. 7.

In FIG. 14D, the panel 58 can be singulated along the dashed lines, wherein a plurality of singulated RF devices 1400 can be obtained. Each of the RF devices 1400 can be similar to the RF device 700 in FIG. 7.

Figure 15A:
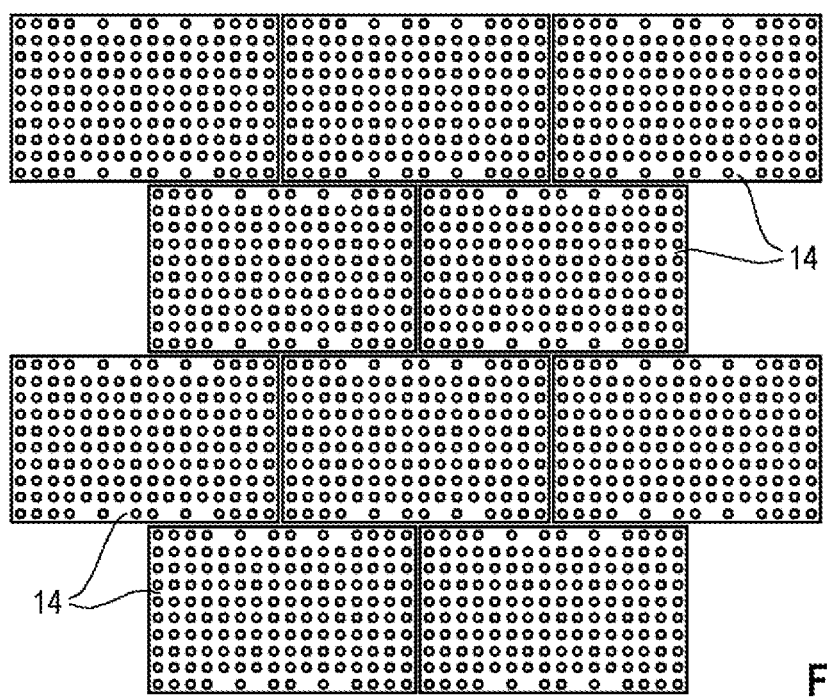
FIGS. 15A to 15C, which schematically illustrate a method in accordance with the disclosure for producing RF devices.
Figure 15B:
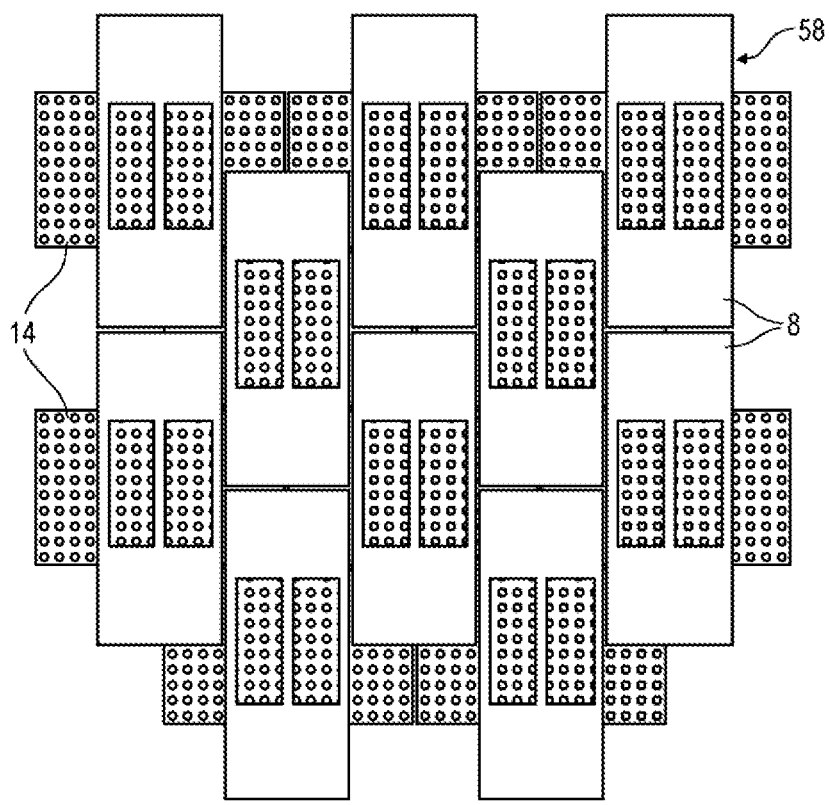
Figure 15C:
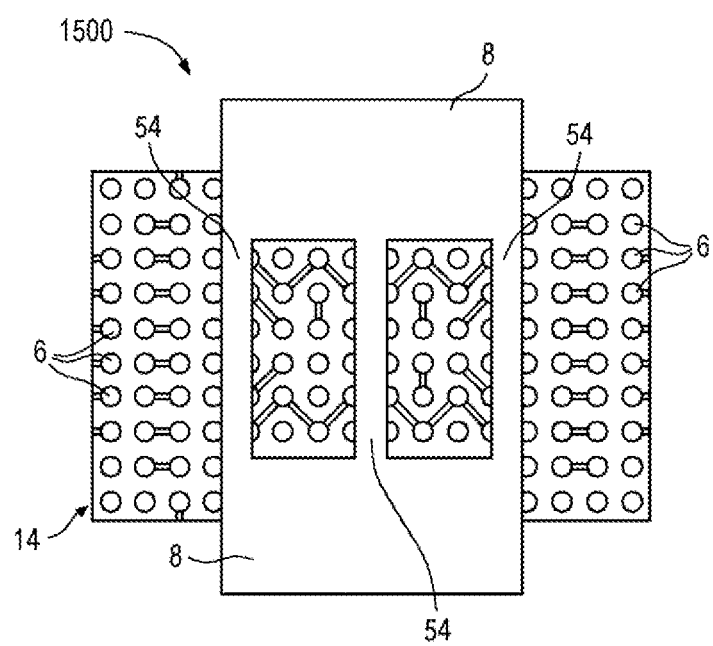

The method shown in FIGS. 15A and 15C can be regarded as a more detailed implementation of the method in FIG. 12. An RF device 1500 produced in accordance with the method in FIG. 15 is shown in FIG. 15C. The RF device 1500 can be similar to the RF device 800 in FIG. 8, for example.

In FIG. 15A, a plurality of RF packages 14 can be provided. In one example, the RF packages 14 can be present in a continuous fashion in the form of a wafer. In a further example, the RF packages 14 can already have been singulated and arranged next to one another.

In FIG. 15B, a panel 58 having a plurality of RF signal carrying elements 8 can be arranged over the RF packages 14. The individual RF signal carrying elements 8 can be mechanically connected to one another, e.g. the panel 58 can be embodied in an integral fashion. The individual RF signal carrying elements 8 can have a shape as shown in FIG. 8. The panel 58 can be arranged over the RF packages 14 in such a way that each of the RF signal carrying elements 8 is positioned over a respective RF package 14.

In FIG. 15C, the panel 58 can be singulated, wherein a plurality of singulated RF devices 1500 can be obtained. Each of the RF devices 1500 can be similar to the RF device 800 in FIG. 8.

EXAMPLES

RF devices with RF signal carrying elements and associated production methods are explained below on the basis of examples.

Example 1 is a radio-frequency device, comprising: a radio-frequency chip; a first connecting element arranged over a chip surface of the radio-frequency chip, the first connecting element being designed to mechanically and electrically connect the radio-frequency chip to a circuit board; and a radio-frequency signal carrying element arranged over the chip surface and electrically coupled to the radio-frequency chip, the radio-frequency signal carrying element being covered by an electrically nonconductive material and being designed to transmit a signal in a direction parallel to the chip surface, wherein the first connecting element and the radio-frequency signal carrying element are arranged at a same level in relation to a direction perpendicular to the chip surface, and wherein the first connecting element is spaced apart from the radio-frequency signal carrying element over a region that is free of the electrically nonconductive material.

Example 2 is a radio-frequency device according to example 1, wherein the radio-frequency signal carrying element comprises a radiation element.

Example 3 is a radio-frequency device according to example 2, wherein the radio-frequency signal carrying element is covered by a dielectric substrate and has at least one structured metal layer arranged over a surface of the dielectric substrate, wherein the structured metal layer forms the radiation element.

Example 4 is a radio-frequency device according to any of the preceding examples, wherein the first connecting element has a larger extent than the radio-frequency signal carrying element in relation to a direction perpendicular to the chip surface.

Example 5 is a radio-frequency device according to any of the preceding examples, wherein the radio-frequency signal carrying element has a larger extent than the first connecting element in relation to a direction parallel to the chip surface.

Example 6 is a radio-frequency device according to any of the preceding examples, wherein: the radio-frequency chip is designed to operate at a frequency of greater than 1 GHz, and the radio-frequency signal carrying element is designed to transmit a signal having a frequency of greater than 1 GHz.

Example 7 is a radio-frequency device according to any of the preceding examples, wherein the first connecting element is designed to transmit a signal having a frequency of less than 1 GHz.

Example 8 is a radio-frequency device according to any of the preceding examples, wherein the first connecting element is designed to provide a thermal path perpendicular to the chip surface in a direction away from the radio-frequency chip.

Example 9 is a radio-frequency device according to any of the preceding examples, wherein the radio-frequency signal carrying element and the radio-frequency chip are mechanically and electrically connected via a second connecting element.

Example 10 is a radio-frequency device according to example 9, wherein the first connecting element has a larger extent than the second connecting element in relation to a direction perpendicular to the chip surface.

Example 11 is a radio-frequency device according to any of examples 1 to 8, wherein the radio-frequency signal carrying element and the radio-frequency chip are electrically coupled in a contactless fashion.

Example 12 is a radio-frequency device according to any of the preceding examples, wherein the radio-frequency signal carrying element projects beyond the contour of the radio-frequency chip in a plan view of the chip surface.

Example 13 is a radio-frequency device according to any of the preceding examples, wherein the radio-frequency signal carrying element has a frame-shaped structure along the contour of the radio-frequency chip in a plan view of the chip surface.

Example 14 is a radio-frequency device according to any of the preceding examples, wherein the radio-frequency signal carrying element covers radio-frequency connections of the radio-frequency device in a plan view of the chip surface.

Example 15 is a radio-frequency device according to any of the preceding examples, wherein the radio-frequency signal carrying element comprises a daughterboard designed to mechanically and electrically connect the radio-frequency device to a circuit board.

Example 16 is a radio-frequency device according to example 15, wherein the daughterboard is designed to transmit a radio-frequency signal from a first surface of the daughterboard through the daughterboard to an opposite surface of the daughterboard.

Example 17 is a radio-frequency device according to any of the preceding examples, furthermore comprising: a third connecting element arranged on a surface of the radio-frequency signal carrying element facing away from the chip surface, wherein the third connecting element is designed to mechanically and electrically connect the radio-frequency signal carrying element to a circuit board.

Example 18 is a radio-frequency device according to any of the preceding examples, furthermore comprising: a circuit board, wherein the radio-frequency chip is mechanically and electrically connected to the circuit board via the first connecting element; and a gap formed between the circuit board and the radio-frequency chip, wherein the first connecting element and the radio-frequency signal carrying element are arranged in the gap.

Example 19 is a radio-frequency device according to example 18, wherein a surface of the circuit board that is arranged below the radio-frequency chip and faces the radio-frequency chip is free of radio-frequency-conducting structures.

Example 20 is a method for producing radio-frequency devices, wherein the method comprises: arranging a plurality of radio-frequency chips, wherein each of the radio-frequency chips comprises a connecting element arranged over a respective chip surface, the connecting element being designed to mechanically and electrically connect the respective radio-frequency chip to a circuit board; arranging a panel having a plurality of radio-frequency signal carrying elements over the chip surfaces of the radio-frequency chips, wherein the radio-frequency signal carrying elements are in each case covered by an electrically nonconductive material and designed to transmit a signal in a direction parallel to the respective chip surface; and singulating the panel, wherein a plurality of radio-frequency devices are obtained, wherein each of the radio-frequency devices comprises at least one radio-frequency chip, a connecting element and a radio-frequency signal carrying element, wherein the connecting element and the radio-frequency signal carrying element are arranged at a same level in relation to a direction perpendicular to the chip surface, and wherein the connecting element is spaced apart from the radio-frequency signal carrying element over a region that is free of the electrically nonconductive material.

Example 21 is a method according to example 20, wherein the plurality of radio-frequency chips are arranged in a first checkered pattern.

Example 22 is a method according to example 21, furthermore comprising: arranging further radio-frequency chips in a second, inverse checkered pattern with respect to the first checkered pattern, wherein each of the further radio-frequency chips comprises a connecting element arranged over a respective chip surface, the connecting element being designed to mechanically and electrically connect the respective radio-frequency chip to a circuit board; arranging the panel over the chip surfaces of the further radio-frequency chips; and singulating the panel further, wherein further radio-frequency devices are obtained, wherein each of the further radio-frequency devices comprises at least one radio-frequency chip, a connecting element and a radio-frequency signal carrying element, wherein the connecting element and the radio-frequency signal carrying element are arranged at a same level in relation to a direction perpendicular to the chip surface, and wherein the connecting element is spaced apart from the radio-frequency signal carrying element over a region that is free of the electrically nonconductive material.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "example" is used in the present text in the sense that it serves as an example, a case or an illustration. An aspect or a configuration that is described as "example" in the present text should not necessarily be understood in the sense as though it has advantages over other aspects or configurations. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present description. Observations made in connection with a device described can also apply to a corresponding method, and vice-versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:
1. A radio-frequency device, comprising:
a radio-frequency chip;
a first connecting element arranged over a chip surface of the radio-frequency chip, the first connecting element being configured to mechanically and electrically connect the radio-frequency chip to a circuit board;
a radio-frequency signal carrying element arranged over the chip surface and electrically coupled to the radio-frequency chip, the radio-frequency signal carrying element being covered by an electrically nonconductive material and being configured to transmit a signal in a direction parallel to the chip surface,
wherein the first connecting element and the radio-frequency signal carrying element are arranged at a same level in relation to a direction perpendicular to the chip surface, and
wherein the first connecting element is spaced apart from the radio-frequency signal carrying element by way of a region that is free of the electrically nonconductive material,
wherein the radio-frequency signal carrying element and the radio-frequency chip are mechanically and electrically connected via a second connecting element, wherein the first connecting element has a larger extent than the second connecting element in relation to a direction perpendicular to the chip surface,
wherein the first connecting element is arranged between the radio-frequency chip and the circuit board, and
wherein the radio-frequency signal carrying element is arranged between the second connecting element and the circuit board.

2. The radio-frequency device as claimed in claim 1, wherein the radio-frequency signal carrying element comprises a radiation element.

3. The radio-frequency device as claimed in claim 2, wherein the radio-frequency signal carrying element is covered by a dielectric substrate and has at least one structured metal layer arranged over a surface of the dielectric substrate, wherein the structured metal layer forms the radiation element.

4. The radio-frequency device as claimed claim 1, wherein the first connecting element has a larger extent than the radio-frequency signal carrying element in relation to a direction perpendicular to the chip surface.

5. The radio-frequency device as claimed in claim 1, wherein the radio-frequency signal carrying element has a larger extent than the first connecting element in relation to a direction parallel to the chip surface.

6. The radio-frequency device as claimed in claim 1, wherein:
the radio-frequency chip is configured to operate at a frequency of greater than 1 GHz, and
the radio-frequency signal carrying element is configured to transmit a signal having a frequency of greater than 1 GHz.

7. The radio-frequency device as claimed in claim 1, wherein the first connecting element is configured to transmit a signal having a frequency of less than 1 GHz.

8. The radio-frequency device as claimed in claim 1, wherein the first connecting element is configured to provide a thermal path perpendicular to the chip surface in a direction away from the radio-frequency chip.

9. The radio-frequency device as claimed in claim 1, wherein the radio-frequency signal carrying element and the radio-frequency chip are mechanically and electrically connected via a second connecting element.

10. The radio-frequency device as claimed in claim 9, wherein the first connecting element has a larger extent than the second connecting element in relation to a direction perpendicular to the chip surface.

11. The radio-frequency device as claimed in claim 1, wherein the radio-frequency signal carrying element and the radio-frequency chip are electrically coupled in a contactless fashion.

12. The radio-frequency device as claimed in claim 1, wherein the radio-frequency signal carrying element projects beyond a contour of the radio-frequency chip in a plan view of the chip surface.

13. The radio-frequency device as claimed in claim 1, wherein the radio-frequency signal carrying element has a frame-shaped structure along a contour of the radio-frequency chip in a plan view of the chip surface.

14. The radio-frequency device as claimed in claim 1, wherein the radio-frequency signal carrying element covers radio-frequency connections of the radio-frequency device in a plan view of the chip surface.

15. The radio-frequency device as claimed in claim 1, wherein the radio-frequency signal carrying element comprises a daughterboard configured to mechanically and electrically connect the radio-frequency device to the circuit board.

16. The radio-frequency device as claimed in claim 15, wherein the daughterboard is configured to transmit a radio-frequency signal from a first surface of the daughterboard through the daughterboard to an opposite surface of the daughterboard.

17. The radio-frequency device as claimed in claim 1, further comprising:
a third connecting element arranged on a surface of the radio-frequency signal carrying element facing away from the chip surface, wherein the third connecting element is configured to mechanically and electrically connect the radio-frequency signal carrying element to the circuit board.

18. The radio-frequency device as claimed in claim 1, wherein the radio-frequency chip is mechanically and electrically connected to the circuit board via the first connecting element; and
the radio-frequency device further comprising:
a gap formed between the circuit board and the radio-frequency chip, wherein the first connecting element and the radio-frequency signal carrying element are arranged in the gap.

19. The radio-frequency device as claimed in claim 18, wherein a surface of the circuit board that is arranged below the radio-frequency chip and faces the radio-frequency chip is free of radio-frequency-conducting structures.

20. A method for producing radio-frequency devices, wherein the method comprises:
arranging a plurality of radio-frequency chips, wherein each of the radio-frequency chips comprises a first connecting element arranged over a respective chip surface, the first connecting element being configured to mechanically and electrically connect the respective radio-frequency chip to a circuit board;
arranging a panel having a plurality of radio-frequency signal carrying elements over chip surfaces of the radio-frequency chips,
wherein the plurality of radio-frequency signal carrying elements are each covered by an electrically nonconductive material and configured to transmit a signal in a direction parallel to the respective chip surface; and
singulating the panel, wherein a plurality of radio-frequency devices are obtained, wherein each of the plurality of radio-frequency devices comprises at least one radio-frequency chip, the first connecting element and a radio-frequency signal carrying element,
wherein the first connecting element and the radio-frequency signal carrying element are arranged at a same level in relation to a direction perpendicular to the chip surface, and
wherein the first connecting element is spaced apart from the radio-frequency signal carrying element by way of a region that is free of the electrically nonconductive material,
wherein the radio-frequency signal carrying element and the radio-frequency device are mechanically and electrically connected via a second connecting element,
wherein the first connecting element has a larger extent than the second connecting element in relation to a direction perpendicular to the chip surface, wherein the first connecting element is arranged between the radio-frequency chip and the circuit board, and wherein the radio-frequency signal carrying element is arranged between the second connecting element and the circuit board.

21. The method as claimed in claim 20, wherein the plurality of radio-frequency chips are arranged in a first checkered pattern.

22. The method as claimed in claim 21, wherein the respective chip surface is a first respective chip surface, wherein the respective radio-frequency chip is a first respective radio-frequency chip, and wherein the method further comprises:

arranging other radio-frequency chips in a second, inverse checkered pattern with respect to the first checkered pattern, wherein each of the other radio-frequency chips comprises a third connecting element arranged over a second respective chip surface, the third connecting element being configured to mechanically and electrically connect a second respective radio-frequency chip to the circuit board; and arranging the panel over the chip surfaces of the other radio-frequency chips.

23. The method as claimed in claim 20, wherein a radio-frequency signal carrying element, of the plurality of radio-frequency signal carrying elements, includes a metal layer designed to match coefficient of thermal expansion of a radio-frequency package with the radio-frequency signal carrying element.

* * * * *